(12) United States Patent
Ikeda et al.

(10) Patent No.: US 7,017,264 B2
(45) Date of Patent: Mar. 28, 2006

(54) METHOD OF MANUFACTURING MULTILAYER WIRING BOARD

(75) Inventors: Kenichi Ikeda, Ibaraki (JP); Toshiyuki Kawashima, Ibaraki (JP); Nobuharu Tahara, Ibaraki (JP); Kazuo Oouchi, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 552 days.

(21) Appl. No.: 10/171,502

(22) Filed: Jun. 11, 2002

(65) Prior Publication Data

US 2002/0192870 A1 Dec. 19, 2002

(30) Foreign Application Priority Data

Jun. 18, 2001 (JP) .............................. 2001-183318
Jan. 10, 2002 (JP) .............................. 2002-003067

(51) Int. Cl.
*H01K 3/10* (2006.01)
(52) U.S. Cl. ............................ 29/852; 29/846; 427/97; 427/99
(58) Field of Classification Search ................. 29/846, 29/852; 427/97, 99
See application file for complete search history.

(56) References Cited

U.S. PATENT DOCUMENTS 3,303,078 A 2/1967 Rubin
6,694,613 B1 * 2/2004 Nakamura et al. ............ 29/846

FOREIGN PATENT DOCUMENTS

| EP | 0 299 595 A2 | 1/1989 |
|----|--------------|--------|
| EP | 0 610 929 A1 | 8/1994 |
| EP | 0 768 334 A2 | 4/1997 |
| GB | 1 476 888 | 6/1977 |
| JP | 5-299796 | 11/1993 |
| JP | 6-209148 | 7/1994 |
| JP | 9-324060 | 12/1997 |
| JP | 2001-127389 A | 5/2001 |

* cited by examiner

*Primary Examiner*—Richard Chang
(74) *Attorney, Agent, or Firm*—Knobbe, Martens, Olson & Bear, LLP

(57) ABSTRACT

The present invention provides a method of manufacturing a multilayer wiring board comprising the step of impregnating a raw material composition of a thermosetting resin in a porous laminated product including two or more porous layers and a wiring layer provided between the porous layers and formed on any of the porous layers and of half curing or curing them. Moreover, the present invention provides a multilayer wiring board having such a lamination structure that two or more porous layers and a wiring layer provided between the porous layers and formed on any of the porous layers are integrated through an impregnated and cured thermosetting resin.

7 Claims, 7 Drawing Sheets

(a)

(b)

(c)

(d)

(e)

(f)

(g)

METHOD OF MANUFACTURING MULTILAYER WIRING BOARD

BACKGROUND OF THE INVENTION

1. Field of the Invention

The present invention relates to a method of manufacturing a multilayer wiring board including the step of impregnating a raw material composition of a thermosetting resin in a porous laminated product including two or more porous layers and a wiring layer provided between the porous layers and formed in any of the porous layers and step of curing or half curing them, and a multilayer wiring board obtained thereby. They are particularly useful as a technique for easily manufacturing a multilayer wiring board having the large number of laminations.

2. Description of the Related Art

In recent years, an increase in a density has been required for a wiring board with a reduction in the size and weight of electronic devices or the like and a wiring layer has had a multilayer structure correspondingly. For the structure of a multilayer wiring board, generally, an insulating layer and a wiring layer having a patter formed thereon are sequentially laminated and the adjacent wiring layers are conductively connected to each other through an inner via hole. As the conductive connecting method, there have been known a method of plating the inner peripheral surface of a via hole, a method of plating the internal space of the via hole to form a metal column, a method of filling a conductive paste in the internal space of the via hole and the like.

As a method of manufacturing the multilayer wiring board having such an interlayer connecting structure, a method of using a lamination unit integrating a prepreg to be an insulating layer and a wiring layer (or a metal foil having no pattern formed thereon) for repeating lamination and heating and pressurization, or a method of sequentially forming the insulating layer and the wiring layer alternately have been put into practical use. In general, the interlayer connecting structure is formed at the middle step between repeating processes.

In the manufacturing method described above, however, the heating and pressurization is repeated for each layer. Consequently, the number of steps is increased corresponding to the number of laminations. Therefore, such a manufacturing method has a poor efficiency for manufacturing a wiring board having a multilayer structure. Referring to the multilayer wiring board thus obtained, moreover, there is a problem in that the insulating layers have a low bonding strength and precision in alignment of the lamination is poor due to the sequential execution of the laminating steps.

Therefore, it is an object of the present invention to provide a method of manufacturing a multilayer wiring board in which the step of integrating laminated products is carried out at the same time so that a multilayer wiring board having a large number of laminations can easily be manufactured, and the multilayer wiring board thus obtained hardly causes a problem of the bonding strength between insulating layers or precision in alignment of the laminations, and the multilayer wiring board obtained thereby.

On the other hand, an increase in the mounting density of an electronic component has recently been required. Consequently, there have been proposed some structures in which a passive component such as a resistor or a capacitor or an active component such as a semiconductor chip is incorporated in the multilayer wiring board. For example, there have been a method of arranging a chip component, a method of forming an element by utilizing a part of a wiring layer, a method of combining both of them and the like.

In these methods, however, there is a problem in that a cavity is to be always provided in a portion in which a chip component is provided or a space between the formed elements is to be maintained in any way.

Therefore, it is another object of the present invention to provide a method of manufacturing a multilayer wiring board in which a space between chip components or various elements can easily be maintained and the multilayer wiring board obtained thereby.

SUMMARY OF THE INVENTION

The above-mentioned objects can be achieved by the present invention in the following manner.

More specifically, the present invention provides a method of manufacturing a multilayer wiring board including the steps of impregnating a raw material composition of a thermosetting resin in a porous laminated product including two or more porous layers and a wiring layer provided between the porous layers and formed on any of the porous layers, and of half curing or curing the raw material composition. According to the manufacturing method of the present invention, a raw material composition of a thermosetting resin is impregnated in a porous laminated product including two or more porous layers and a wiring layer provided between the porous layers and formed on any of the porous layers. Therefore, the raw material composition wholly spreads to the porous layer and is half cured or cured. Consequently, it is possible to obtain a lamination structure in which the wiring layer is provided and integrated between insulating layers. Thus, the step of integrating the laminated product can be carried out at the same time and a multilayer wiring board having a large number of laminations can be manufactured readily. Moreover, the multilayer wiring board thus obtained has no boundary surface between the insulating layers. For this reason, there is no problem of a bonding strength between the insulating layers and it is not necessary to carry out a heating and pressurizing step by sequentially performing the lamination. Consequently, a problem of precision in alignment of the lamination can be improved more greatly as compared with the conventional art.

In the foregoing, it is preferable that the porous laminated product should include two or more wiring layers and should be set in a state in which a pattern portion of the wiring layer can be conductively connected between the wiring layers through a conductor in a through hole provided in the porous layer or a conductive connecting state. In this case, the step of integrating a laminated product having a plurality of wiring layers is carried out and, at the same time, the conductive connecting structure between the wiring layers can be formed. Therefore, the multilayer wiring board having the wiring layers connected conductively can be manufactured more efficiently. Moreover, in the case in which the conductive connecting state is previously brought between the layers by a conductive in a through hole provided on the porous layer, since the layers are conductively connected to each other before the step of integrating a laminated product is carried out, the conductive connection has more reliability.

Moreover, it is preferable that the porous laminated product should comprise a lamination unit including a porous layer having a plurality of through holes, a wiring layer formed on at least one of surfaces of the porous layer, and a conductor erected in the through hole from the pattern portion of the wiring layer. In this case, each lamination unit can be manufactured in the same manner by using the porous laminated product consisting of a plurality of the lamination units. Therefore, it is possible to more efficiently manufacture the multilayer wiring board having the wiring layers connected conductively.

In that case, it is preferable that the manufacturing method should further comprise the steps of using a metal foil including a conductive bump having an almost equal height on a film forming side surface to form and attach a resin porous layer onto the metal foil by a wet coagulating method and the step of etching the metal foil to form a pattern portion of the wiring layer to obtain the lamination unit. In this case, the formation of the porous layer, the bonding of the metal foil and the formation of the through hole can be carried out at the same time. Consequently, the fabrication efficiency of the lamination unit can be more enhanced.

Moreover, it is preferable that the porous laminated product should be set in a state in which at least one of a passive component, an active component and an element constituting them is interposed between the porous layers and can be conductively connected to the wiring layer or a conductive connecting state. In this case, since the components are provided between the porous layers, it is easy to maintain a space in which the components are arranged by the deformation of the porous layer.

Alternatively, it is preferable that the porous laminated product should be set in a state in which at least one of a passive component, an active component and an element constituting them is provided in an opening portion of the porous layer and can be conductively connected to the wiring layer or a conductive connecting state. Also in this case, the upper and lower porous layers of the opening portion can be deformed. Therefore, the number of the layers to be provided with the opening portion can be decreased, which is advantageous to the incorporation of the components into the multilayer wiring board.

On the other hand, the present invention provides a multilayer wiring board having such a lamination structure that two or more porous layers and a wiring layer provided between the porous layers and formed on any of the porous layers are integrated through an impregnated and cured thermosetting resin. According to the multi layer wiring board of the present invention, since the multilayer wiring board having the above lamination structure, the multilayer wiring board can be manufactured readily by the steps described above. The multilayer wiring board thus obtained has no boundary surface between the insulating layers. Therefore, there is no problem of a bonding strength between insulating layers and it is not necessary to carry out the heating and pressurizing step by sequentially performing the lamination. Consequently, a problem of precision in alignment of the lamination can be improved more greatly than that in the conventional art.

In the foregoing, it is preferable that in the lamination structure, two or more wiring layers should be provided and a pattern portion of the wiring layer should be conductively connected between the layers by a conductor in a through hole provided in the porous layer. In this case, it is possible to easily manufacture the multilayer wiring board in which the wiring layers are conductively connected as described above. The multilayer wiring board thus obtained is also impregnated with a resin without a boundary around a conductor. Consequently, the cutoff of the conductive connection is hardly caused by the partial separation of the insulating layers, so that a durability can also be enhanced.

Moreover, it is preferable that in the lamination structure, at least one of a passive component, an active component and an element constituting them should be interposed between the porous layers and should be conductively connected to the wiring layer. In this case, since the components are provided between the porous layers, it is easy to maintain a space in which the components are to be arranged.

Alternatively, it is preferable that in the lamination structure, at least one of a passive component, an active component and an element constituting them should be provided in an opening portion of the porous layers and should be conductively connected to the wiring layer. Also in this case, since the upper and lower porous layers of the opening portion can be deformed, the number of the layers to be provided with the opening portion can be decreased, which is advantageous to the incorporation of the components into the multilayer wiring board.

DETAILED DESCRIPTION OF THE PREFERRED EMBODIMENTS

Figure 1:
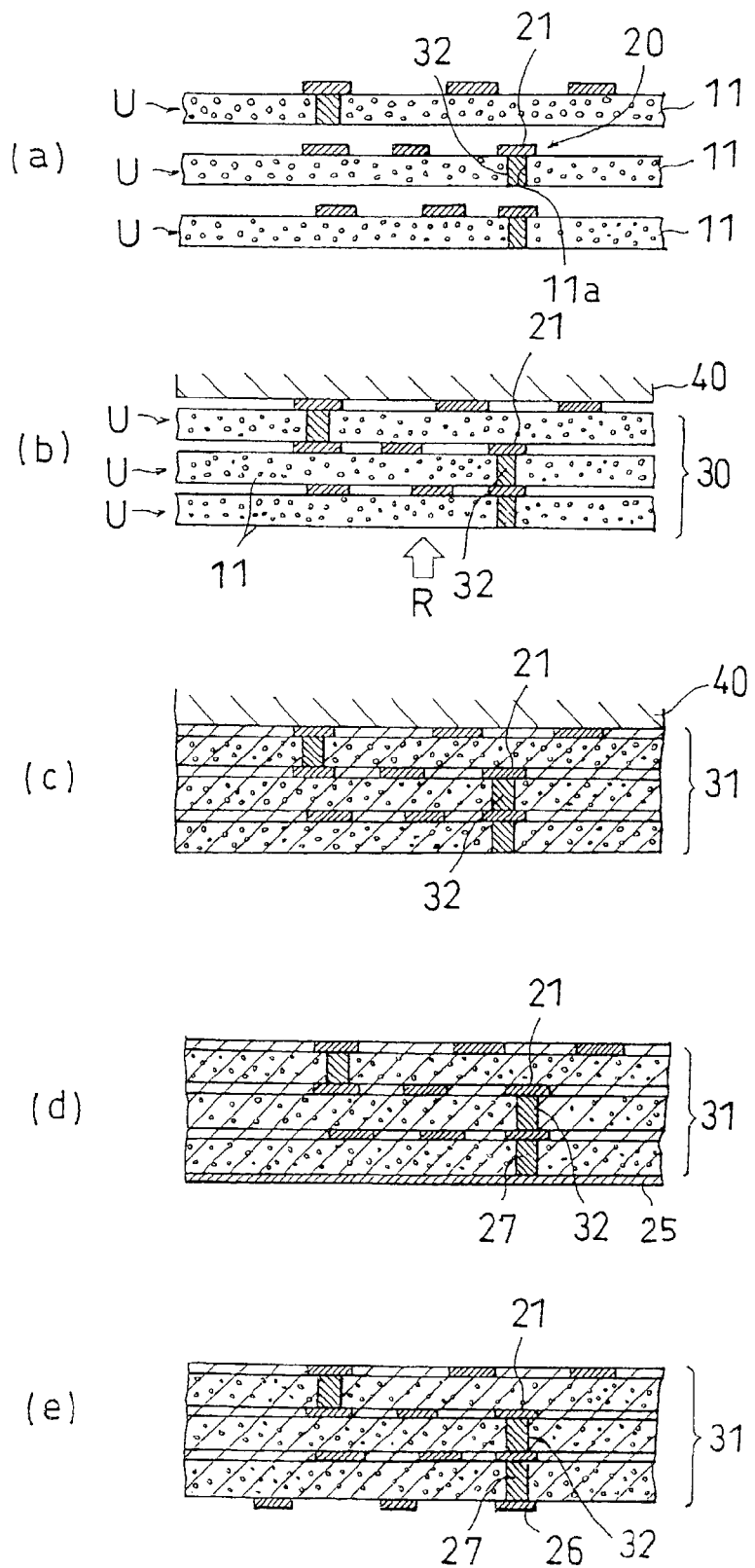
FIG. 1(a) to FIG. 1(e) are views showing a process for a method of manufacturing a multilayer wiring board according to a first embodiment of the present invention.

Preferred embodiment of the present invention will be described below with reference to the drawings.

(First Embodiment)

FIG. 1(a) to FIG. 1(e) are views showing a process for a method of manufacturing a multilayer wiring board according to a first embodiment of the present invention. As shown in FIG. 1 (a) to FIG. 1 (e), the method of manufacturing a multilayer wiring board according to the present invention includes the step of impregnating a raw material composition in a thermosetting resin in a porous laminated product 30 including two or more porous layers 11 and a wiring layer 20 provided between the porous layers 11 and formed in any of the porous layers 11 and step of half curing or curing them. In the present embodiment, there will be described an example in which the porous laminated product 30 includes two or more wiring layers 20 and a pattern portion 21 of the wiring layer can be conductively connected between the layers through a conductor 32 in a through hole 11a provided on the porous layer 11.

In the present embodiment, in an example shown in FIG. 1(a), a lamination unit U comprises the porous layer 11 having the plurality of through holes 11a, the wiring layer 20 formed on at least one of surfaces of the porous layer 11, and the conductor 32 erected in the through hole 11a from the pattern portion 21 of the wiring layer 20.

In order to fabricate the lamination unit U, as shown in FIG. 2(a) to FIG. 2(g), it is preferable to comprise the step of providing and attaching by a wet coagulating method, the porous layer 11 formed of a resin on a metal foil 10 having a conductive bump 2a which is almost equal height on the side surface of film formation, and the step of etching a metal foil 1 of the metal foil 10 having a bump, thereby forming the pattern portion 21 of the wiring layer 20.

First of all, description will be given to a method of forming the metal foil 10 having a bump. Example of the method of forming the metal foil 10 having a bump include a forming method using etching as shown in FIG. 2(a) to FIG. 2(g), a forming method using plating, a forming method using a conductive paste and the like.

Figure 2:
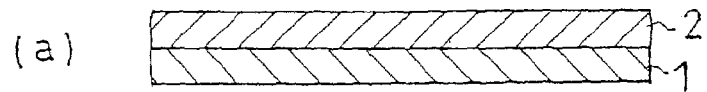
FIG. 2(a) to FIG. 2(g) are views showing the process for the method of manufacturing a multilayer wiring board according to the first embodiment of the present invention.
Figure 2:
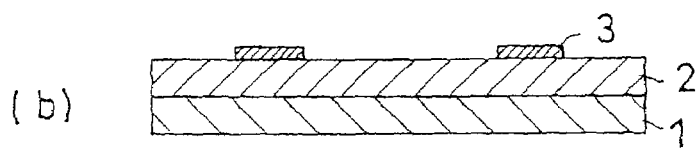
Figure 2:
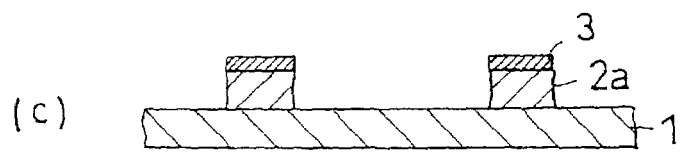
Figure 2:
Figure 2:
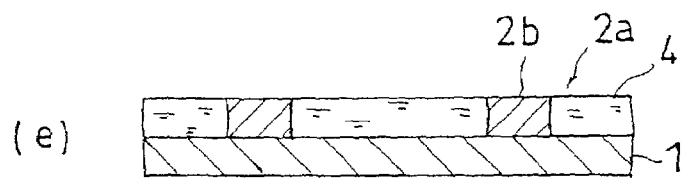
Figure 2:
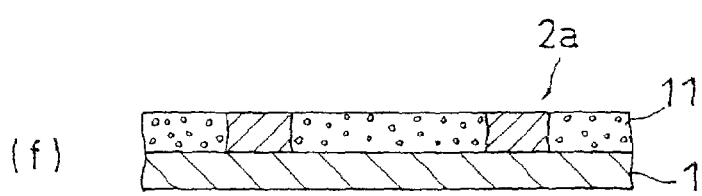
Figure 2:
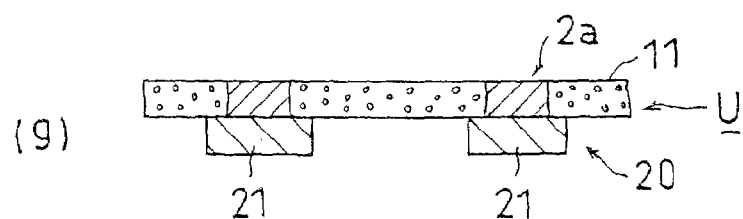
Figure 3:
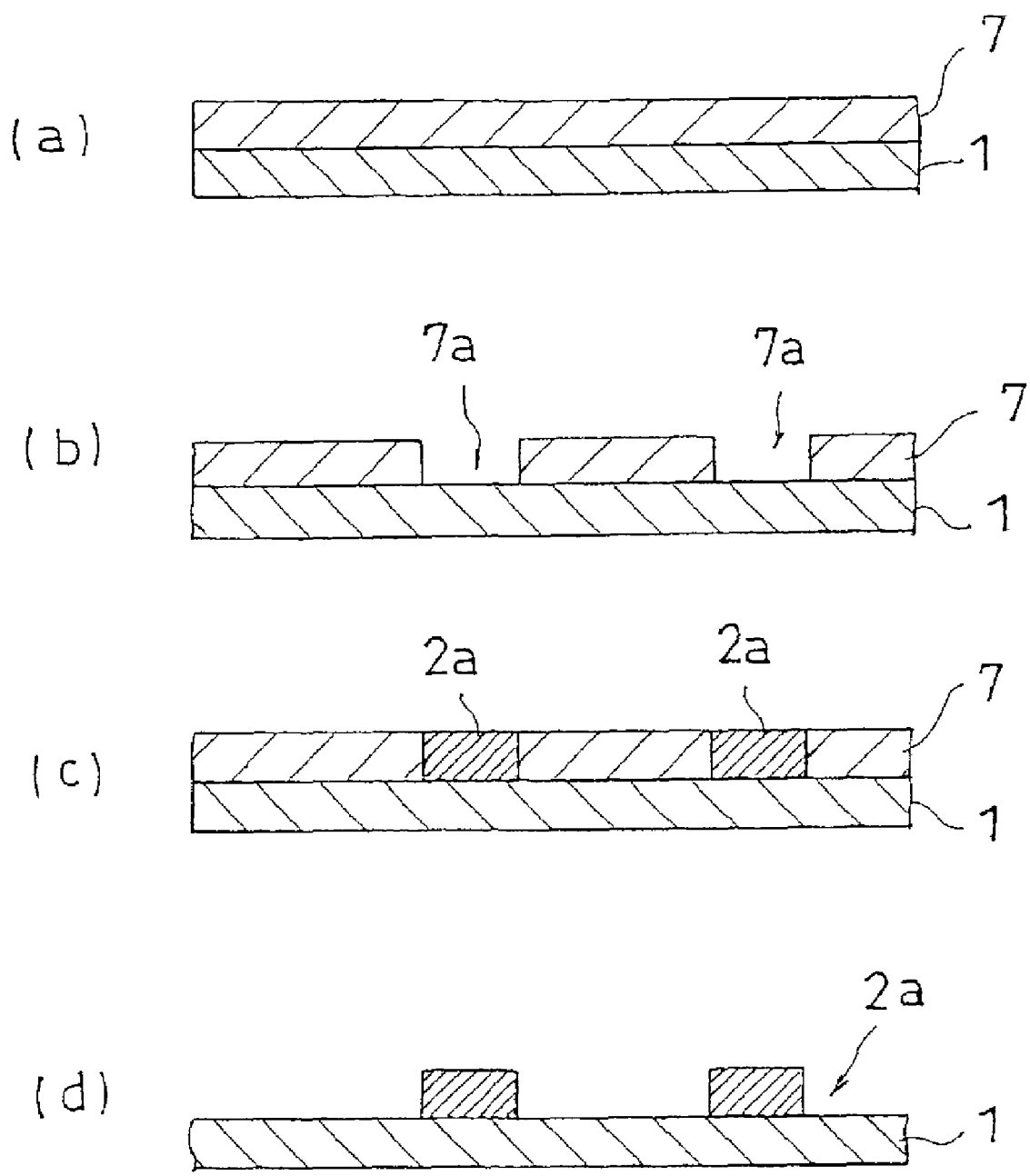
FIG. 3(a) to FIG. 3(d) are views showing the process for the method of manufacturing a multilayer wiring board according to the first embodiment of the present invention.

For the forming method using etching, as shown in FIG. 2(a), a metal laminated plate comprising two kinds of metal layers 1 and 2 is first prepared. One of the metal layers 1 and 2 constituting the metal laminated plate may become the wiring layer and the other may become the conductive bump 2a. Therefore, a metal is selected corresponding to each material. For the materials of the metal layers 1 and 2, copper, cupro-nickel, bronze, brass, aluminum, nickel, iron, stainless, gold, silver, platinum and the like can be used. It is preferable that these metal layers 1 and 2 should have thicknesses of 1 to 50 µm. It is preferable that a surface on the film formation side of the metal layer 1 should be subjected to various physical or chemical surfacing processes such as a rough surfacing process or a blacking process in order to enhance an adhesion to the porous layer 11.

In the present invention, it is preferable that the metal layer 1 to be the wiring layer should be formed of copper in respect of an adhesion to the resin porous layer 11 formed by the wet coagulating method, the workability of the wiring pattern and the like. Moreover, a metal which can be selectively etched during the etching without corroding the metal layer 1 is selected for the metal layer 2. More specifically, aluminum or the like can be used. A cladding material, a plating material and the like can be used for the metal laminated plate.

As shown in FIG. 2(b), next, a mask layer 3 for resisting the etching is formed in a portion on the surface of the metal layer 2 on which the conductive bump 2a is to be formed. Screen printing or photolithography can be utilized for forming the mask layer 3. The size of each mask layer 3 is determined by the area of the upper surface of the conductive bump 2a and can have a diameter of 5 to 500 µm. Moreover, the shape of the upper surface of the conductive bump 2a can be controlled by the shape of each mask layer 3 and can be a circle, a square, a shape formed in conformity with a wiring pattern and the like.

As shown in FIG. 2(c), next, the metal layer 2 is etched to form the conductive bump 2a. In that case, it is preferable that etching conditions are adjusted to prevent excessive undercutting. The etching is preferably carried out by using an etchant for selectively etching the metal layer 2.

As shown in FIG. 2(d), then, the mask layer 3 is removed. As a removing method, removal using chemicals or separating removal is preferably carried out. Consequently, it is possible to form the metal foil 10 having the conductive bump 2a which is almost equal height on the side surface of film formation.

As shown in FIGS. 2(e) and 2(f), thereafter, the resin porous layer 11 is formed and attached by the wet coagulating method utilizing the metal foil 10 having the bump described above. In that case, it is preferable that the amount of a film formation solution 4 should be applied such regulation that the surface of the resin porous layer 11 is almost on a level with the conductive bump 2a after the film formation. In the present invention, it is preferable that the porous layer 11 should have a vacancy rate of 30 to 90% and a mean pore size of 0.1 to 10 µm. A resin having an excellent heat resistance and a high mechanical strength is preferable for the material of the porous layer 11 to be used in the present invention, and it is possible to employ various resins such as polyimide, polyester, polyamide, particularly, aromatic polyamide, polyamideimide, polyetherimide, polyether sulfone and polyether ketone. Above all, a polyimide based resin is preferable because of an excellent insulating property and heat resistance and an excellent adhesion with a metal layer. Moreover, the aromatic polyamide is preferable because of an excellent insulating property and heat resistance and a lower coefficient of thermal linear expansion.

In the wet coagulation process, generally, a film forming solution (dope) having a resin and an additive dissolved in a solvent is prepared and is applied (cast) to a film forming base material, and is then immersed in a coagulating solution to carry out solvent substitution. Consequently, the resin is coagulated (changed into a gel) and the coagulating solution is then dried and removed. Thus, the porous layer can be obtained.

The polyamide based resin mainly including a repetition unit in which an acid residue and an amine residue is imide bonded may contain other copolymerized components and blended compounds. In respect of a heat resistance, a hydroscopic property and a mechanical strength, polyimide having an aromatic group as a main chain, for example, polyimide composed of a polymerized product containing a tetracarboxylic acid component and an aromatic diamine component can be employed. In particular, it is desirable that a polymer having a limiting viscosity of 0.55 to 3.00, preferably, 0.60 to 0.85 (a measured value at 30° C.) can be used. In the case in which a porous film is to be formed by the wet coagulation process, the polymer having the limiting viscosity within the above range can be formed into a porous film having an excellent dissolving property in a solvent, a great mechanical strength and independence.

Referring to the polyamide based resin, a polymer or a precursor thereof (polyamide acid) can be used for film formation. The polyamide acid has an advantage that a molecular structure is less restricted because it has a more excellent dissolving property as compared with polyimide. While the polymer may be completely changed into imide, 70% or more of a change rate to imide is permitted. In the case in which a polymer having a comparatively high change rate to imide is used for doping, it is preferable to use a polymer including, in a repetition unit, a component having a high flexibility such as butanetetradicarboxylic anhydride.

Any solvent for dissolving the polyimide based resin or the precursor thereof can be used. It is preferable to use an aprotic polar solvent such as N-methyl-2-pyrrolidone, N,N-dimethylacetamide, N,N-dimethylformamide or dimethylsulfoxide in respect of a dissolving property and a solvent substitution speed for a coagulating solvent in the case in which a porous film is formed by the wet coagulation process. Preferable examples include N-methyl-2-pyrrolidone. Moreover, a solvent such as diethylene glycol, dimethyl ether or diethyleneglycol diethylether maybe mixed to regulate the speed of a solvent substitution in the wet coagulation process.

On the other hand, the aromatic polyamide includes so-called para type aramid and metha type aramid, and those in which a part of their main chain is substituted by diphenyl ether, diphenyl propane, diphenyl methane, diphenyl ketone, diphenyl sulfoxide or those in which biphenyl or a hydrogen group of an aromatic ring is substituted by a methyl group, a halogen atom or the like.

Examples of the para type aramid include poly p-phenyleneterephthalamide. The aramid thus constituted by only a rigid component is to be dissolved in a special reagent. For the aromatic polyamide used for the porous layer, accordingly, it is preferable to at least partially use aramid having a part of main chain substituted by a component having a flexibility or the metha type aramid.

Examples of the component giving a flexibility include m-phenylene, 2,7-naphthalene, diphenyl ether, 2,2-diphenyl propane and diphenyl methane. Such component is used as a dicarboxylic monomer or a diamine monomer for copolymerization and is thus introduced into a bone structure. The component having a higher copolymerization ratio generally has a more excellent dissolving property for a solvent.

Examples of the solvent for dissolving the aromatic polyamide include tetramethyl urea, hexamethyl phospholamide, N,N-dimethyl acetamide, N-methyl-2-pyrrolidone, N-methylpiperidone-2, N,N-dimethylethylene urea, N,N,N', N'-tetramethyl allonic amide, N-methyl caprolactam, N-acethyl pyrrolidine, N,N-diethyl acetamide, N-ethyl pyrrolidone-2, N,N-dimethyl propionic amide, N,N-dimethyl isobutyl amide, N-methyl formamide, N, N-dimethyl propylene urea and their mixed systems. Furthermore, it is preferable to use an aprotic polar solvent such as N-methyl-2-pyrrolidone, N,N-dimethyl acetamide or N,N-dimethyl formamide in respect of a dissolving property and a solvent substitution speed for a coagulating solvent. More preferable examples include N-methyl-2-pyrrolidone.

Moreover, a solvent such as diethyleneglycol dimethy ether or diethyleneglycol diethyl ether or diethyleneglycol dibutyl ether may be mixed to regulate the speed of a solvent substitution.

Preferably, the dope in the wet coagulation process is applied data temperature of −20 to 40° C. Moreover, it is possible to use any coagulating solution which does not dissolve a resin to be used and has a compatibility with the solvent. For the coagulating solution, water, alcohols such as methanol, ethanol and isopropyl alcohol and their mixed solution can be used, particularly, the water can be used suitably. The temperature of the coagulating solution at time of immersion is not particularly restricted but a temperature of 0 to 90° C. is preferable.

The polymer concentration of a film forming solution preferably ranges from 5% by weight to 25% by weight, more preferably, 7% by weight to 20% by weight. If the concentration is too high, a viscosity is excessively increased and handling is hard to perform. If the concentration is too low, a porous film tends to be formed with difficulty.

In order to regulate a pore shape and a pore size, an inorganic material such as lithium nitrate or an organic material such as polyvinyl pyrrolidone can also be added. It is preferable that the concentration of an additive should be 1% by weight to 10% by weight in a solution. If the lithium nitrate is added, the substitution speed of a solvent and a coagulating solution is increased and a finger void structure (a structure having a finger-like void) is formed in a sponge structure. When an additive for reducing a coagulation speed such as polyvinyl pyrrolidone is added, it is possible to obtain a porous layer having a sponge structure expanded uniformly.

The dope is applied to have a constant thickness and is immersed in a coagulating solution such as water and is thus coagulated or is left in a water vapor atmosphere and is thus coagulated and is then immersed in the water. Thus, the solvent is removed so that a porous film is formed. After the porous film is formed, it is taken out of the coagulating solution and is then dried. A drying temperature is not particularly limited but is desirably 200° C. or less.

In the present invention, it is preferable that an upper surface 2b of the conductive bump 2a should be exposed from the porous layer 11 after the film formation as shown in FIG. 2(f). This can be achieved by regulating a coating thickness t. In that case, the thickness of the porous layer obtained may be slightly lowered than the conductive bump by the contraction of the film. Accordingly, it is desirable to use a method of exposing the upper surface of the conductive bump while increasing the coating thickness t. Examples of such a method include a method of using a metal (having a great contact angle) for repelling the film formation solution as a metal constituting the conductive bump, and examples of such a metal include copper, aluminum and stainless. Moreover, there is also used a method carrying out a surfacing process over the upper surface of the conductive bump.

In the case in which the upper surface of the conductive bump is not exposed from the porous layer after the film formation, it is possible to remove the porous layer formed on the surface portion by sputter etching, polishing, plasma etching, a surface alkali treatment or the like.

When the porous layer is formed of a polyimide based resin by using a precursor (ie.polyamide acid), a heat treatment is finally carried out at 200 to 500° C. to heat and ring-close the precursor.

In a metal foil laminated plate thus obtained, as shown in FIG. 2(g), the pattern portion 21 is formed against the metal layer 1 by etching using an etchant, thereby constituting the wiring layer 20. For the etching, an etchant corresponding to the type of the metal can be used. For the pattern etching, a dry film resist or the like can be used.

The lamination unit U thus obtained is provided as shown in FIG. 1(b), and constitutes a porous laminated product 30. When the lamination unit U is to be provided, it is preferable that positioning should be carried out by using a guide pin or the like. Moreover, it is also possible to carry out the step of temporarily bonding the lamination unit U during the providing step or the cutting step.

In the present invention, it is also possible to connect the pattern portion 21 and the conductor 32 in a contact state through solder reflow or the like prior to the impregnation of a resin in order to reliably conductively connect the layers. More specifically, the porous laminated product 30 includes two or more wiring layers 20 and the pattern portion 21 of the wiring layer 20 is conductively connected between the layers through the conductor 32 in the through hole 11a provided on the porous layer 11. In that case, a solder coating layer may be formed by separately performing solder plating over the surface of the conductor 32. It is preferable that the mask layer 3 shown in FIG. 2(b) should be subjected to solder pattern plating or the like and should be used without removal. Moreover, it is also possible to use a metal having a comparatively low melting point in place the solder. Moreover, it is also possible to use a solder having a higher melting point than a solder to be used at the step of reflowing an electronic component.

In the present invention, as shown in FIGS. 1(b) and 1(c), the porous laminated product 30 is impregnated with a raw material composition R of a thermosetting resin and is half cured or cured. In the present embodiment, the raw material composition R is impregnated and half cured to prepare a half cured product 31, and a metal foil 25 is further provided thereon. Then, heating and pressurization are carried out to cure the half cured product 31 and bond a metal foil 25 thereto (see FIG. 1(d)).

Examples of a method of impregnating the raw material composition R of the thermosetting resin include a method of supporting the porous laminated product 30 on a support plate 40 having a flat surface on one surface side and directly coating the surface of the porous laminated product 30 with the raw material composition R of the thermosetting resin by various coaters or the like, and a method of laminating a solid coating film obtained by coating and drying the raw material composition R on the surface of a base material sheet and impregnating them by heating and pressurization. Moreover, the raw material composition R may be impregnated and half cured or cured in the same manner as in injection molding or transfer molding for the thermosetting resin.

In the case in which the metal foil provided on any most surface is patterned as in the present embodiment, the area of a non-pattern portion is equal to or larger than a half of the whole surface. Therefore, it is possible to easily impregnate the raw material composition R from the surface. Also in the case in which the metal foil on the most surface or the like is not patterned, the raw material composition R can be impregnated from the peripheral edge portion of the porous laminated product 30.

Examples of the thermosetting resin includes an epoxy resin, a phenol resin, a polyimide resin, polyamide acid and the like, and the epoxy resin, a mixture of the epoxy resin and other resins and the like are preferable in respect of cost and easy handling. The raw material composition of the thermosetting resin may contain a catalyst, a curing agent, a flame retardant, a filler, a plasticizer, an accelerator and the like in addition to a solvent. Examples of the solvent contained in a raw material solution for the thermosetting resin include ketones, acetate esters, ethers, aromatic hydrocarbons, alcohols and the like.

When the raw material composition R is half cured in the present embodiment, the well-known conditions corresponding to the type of a resin or the like are preferably set to the half curing conditions. It is preferable that the porous laminated product 30 should be pressurized on such a condition that the raw material composition R does not enter the contact surface between the surface of the pattern portion 21 and the conductor 32 in the porous laminated product 30. For specific pressurizing conditions, 0.1 to 100 MPa is preferable and 0.5 to 50 MPa is more preferable.

As shown in FIG. 1(d), then, a metal foil 25 is further provided on the half cured product 31 and the half cured product 31 is cured to bond the metal foil 25 by heating and pressurization. The curing conditions may be set depending on the type of the resin or the like. At that time, it is preferable that the surface of a conductor 27 should be completely exposed to the laminated surface of the metal foil 25 in order to enhance the reliability of the conductive connection between the layers. As a method of previously exposing the conductor 27, it is preferable to polish the whole surface or to carry out removal by using chemicals.

As shown in FIG. 1(e), thereafter, it is preferable that the metal foil 25 should be patterned by etching using an etchant or the like. Consequently, it is possible to manufacture a multilayer wiring board having four layers with an interlayer connecting structure. According to the present embodiment, it is possible to manufacture a multilayer wiring board having the number of lamination units U and one layer by a simple method.

As shown in FIG. 1(e), the multilayer wiring board of the present invention has such a lamination structure that the porous layer 11 having two or more layers and the wiring layer 20 provided between the porous layers 11 and formed on any of the porous layers 11 are integrated by a thermosetting resin which is impregnated and cured. Moreover, it is preferable that the lamination structure should have two or more wiring layers 20 and the pattern portion 21 of the wiring layer 20 should be conductively connected between the layers through the conductor 32 in the through hole 11a provided on the porous layer 11.

(Variant of First Embodiment)

In the embodiment described above, the metal foil 10 having a bump is formed by the etching. In the case of formation using plating, the following method can be employed. More specifically, as shown in FIGS. 3(a) to 3(d), a dry film resist 7 is first provided on a metal layer 1 and is exposed and developed to form an opening 7a. By carrying out electrolytic plating or the like over that portion, then, a conductive bump 2a can be formed. Thereafter, it is preferable that the dry film resist 7 should be removed by using chemicals or be removed by a separation. According to such a method, the conductive bump 2a and the metal layer 1 can be formed of the same metal. In the case in which the height of the conductive bump 2a is nonuniform, it can become uniform by cutting, polishing or the like.

Moreover, in the case in which the conductive bump 2a is to be formed of a conductive paste, it is preferable that the conductive paste should be printed in a predetermined portion by a printing method such as screen printing. In that case, the printing may be carried out separately several times in order to cause a thickness to be constant or more.

(Second Embodiment)

Figure 4:
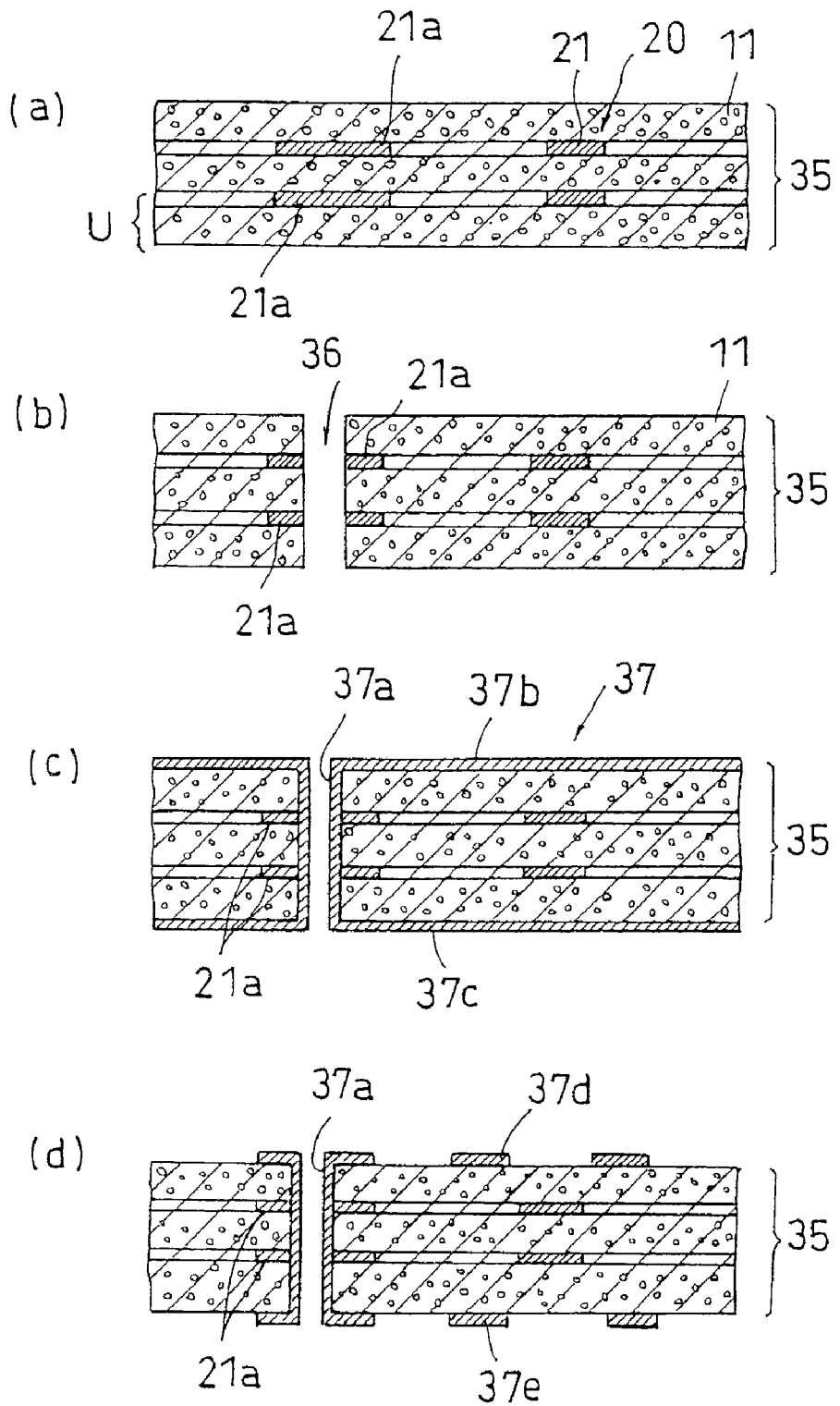
FIG. 4(a) to FIG. 4(d) are views showing a process for a method of manufacturing a multilayer wiring board according to a second embodiment of the present invention.

FIG. 4(a) to FIG. 4(d) are views showing a process for a method of manufacturing a multilayer wiring board according to a second embodiment of the present invention. In the second embodiment of the present invention, a raw material composition R of a thermosetting resin is previously impregnated and cured in a porous laminated product 30, and a conductive connecting structure between wiring layers is then formed. By this method, as shown in FIG. 4(a), the raw material composition of a thermosetting resin is impregnated and cured in the porous laminated product 30 by using a lamination unit U including a porous layer 11 having no through hole and a wiring layer 20 formed on at least one of the surfaces of the porous layer 11 in the same manner as in the first embodiment.

As shown in FIG. 4(b), next, a through hole 36 penetrating through a whole cured product 35 is formed by drilling or the like. In that case, if the conductive connection with the intermediate wiring layer 20 is to be carried out, it is preferable that a diameter increasing portion 21a (pad) having the diameter of a pattern increased should be formed and a hole should be opened to be a through hole 36 to penetrate through the diameter increasing portion 21a in order to enhance the reliability of the interlayer connection.

As shown in FIG. 4(c), then, a plated layer 37 is formed by nonelectrolytic plating, electrolytic plating or the like. It is preferable that the electrolytic plating should be carried out by using the nonelectrolytic plated layer as a plating electrode after the nonelectrolytic plating is carried out. The plated layer 37 includes both surface portions 37b and 37c and a through hole plated portion 37a provided on the internal surface of the through hole 36.

As shown in FIG. 4(d), thereafter, pattern portions 37d and 37e are formed by etching or the like. In that case, it is preferable that an etching resist should be provided in an opening portion such that the through hole plated portion 37a is not etched.

The through hole plated portion 37a can conductively connect the wiring layers provided on both surfaces and can conductively connect the intermediate wiring layer. In the present invention, it is also possible to provide an insulating layer having no conductive connecting structure between the wiring layers.

(Variant of Second Embodiment)

While the example in which the through hold 36 penetrating through the whole layers of the cured product 35 is provided to form the interlayer connecting structure has been described in the embodiment, it is also possible to provide an opening penetrating through only a part of the layers. For example, it is also possible to form an opening reaching a pattern portion 21 of an internal wiring layer 20 by using a laser or the like and to form a plated layer covering the inside of the opening and the pattern portion 21, thereby carrying out the conductive connection between the layers.

When the cured product 35 is to be obtained, moreover, a metal foil may be provided and bonded to both surfaces and a through hole 36 may be formed thereon by drilling or the like to be subjected to through hole plating.

(Third Embodiment)

FIG. 5(a) to FIG. 5(f) are views showing a process for a method of manufacturing a multilayer wiring board according to a third embodiment of the present invention. In the third embodiment according to the present invention, as shown in FIG. 5(a) to FIG. 5(f), a raw material composition R is impregnated from the peripheral edge portion of a porous laminated product 30 by using a lamination unit U1 having a metal foil 22 which is not patterned.

Figure 5:
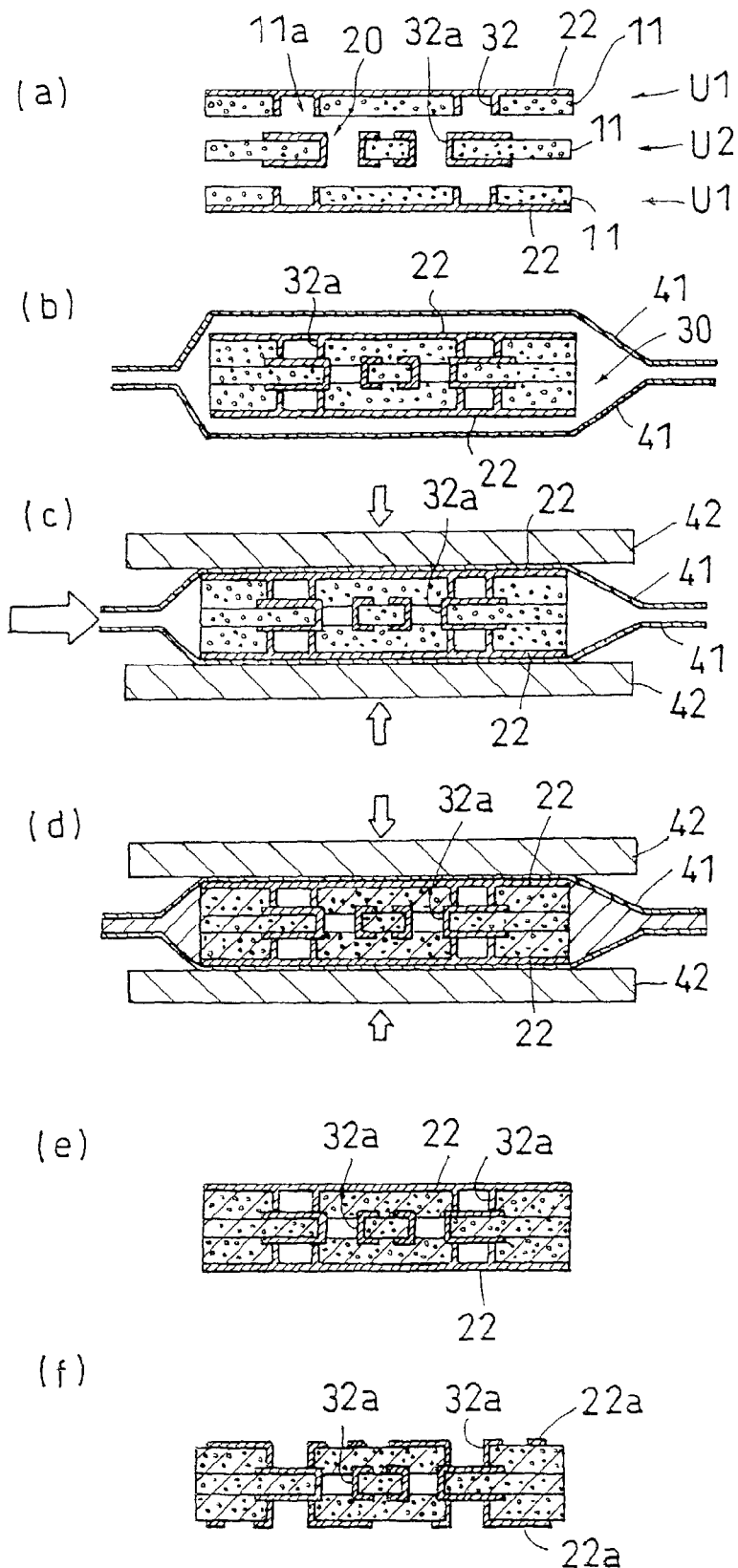
FIG. 5(a) to FIG. 5(f) are views showing a process for a method of manufacturing a multilayer wiring board according to a third embodiment of the present invention.

As shown in FIG. 5(a), first of all, there are prepared a lamination unit U1 comprising a porous layer 11 having a plurality of through holes 11a, a metal foil 22 formed on one of the surfaces of the porous layer 11 and a through hole plating 32a formed in the through hole 11a, and a lamination unit U2 comprising a porous layer 11 having a plurality of through holes 11a, a wiring layer 20 formed on both surfaces of the porous layer 11, and a through hole 32a formed in the through hole 11a.

The lamination unit U1 can be fabricated in the following manner, for example. When previously forming the porous layer 11 on the metal foil 22 and then forming the through hole 11a on the porous layer 11 by a laser process or the like, the laser irradiation condition is adjusted so that the surface of the through hole 11a is coated with melted layer. For such a through hole 11a, nonelectrolytic plating is carried out with other portions resisted. Consequently, it is possible to fabricate the lamination unit U1 including the through hole plating 32a having a comparatively uniform thickness.

Moreover, the lamination unit U2 can be fabricated in the following manner, for example. When previously forming the porous layer 11 having a skin layer on the surface of the metal foil 22 and then forming the through hole 11a by a laser process or the like, the laser irradiation condition is adjusted so that the surface of the through hole 11a is coated with melted layer. By carrying out the nonelectrolytic plating over the inside of the through hole 11a and the surface of the skin layer, it is possible to obtain a double-sided metal foil laminated plate having the through hole plating 32a having a comparatively uniform thickness and a metal layer on both surfaces. By carrying out pattern etching over the metal layer, it is possible to fabricate the lamination unit U2 having the wiring layer 20 on both surfaces.

As shown in FIG. 5(b), next, the porous laminated product 30 having the above lamination units is interposed between two guiding sheets 41. The guiding sheet 41 can prevent the raw material composition R of a thermosetting resin from going around both surfaces of the porous laminated product 30. While a sheet formed of a heat-resistant resin which is resistant to heating can be used for the guiding sheet 41, it is preferable that a heat-resistant adhesive layer such as a silicone based adhesive should be provided on a surface of the guiding sheet 41 in order to reliably prevent the raw material composition R from going around.

As shown in FIG. 5(c), next, while porous laminated product 30 is pressed from both surfaces by a metal mold 42, the raw material composition R of a thermosetting resin is compressed and injected in this state and is thus impregnated in the porous laminated product 30. At this time, the heating temperature of the metal mold 42 may be set to obtain a sufficient fluidity and so as not to cure the raw material composition R.

As shown in FIG. 5(d), furthermore, while the raw material composition R is pressed from both surfaces by the metal mold 42, it is cured in this state. At this time, the heating temperature of the metal mold 42 may be set to sufficiently cure the impregnated raw material composition R.

As shown in FIGS. 5(e) and 5(f), then, the pressing is released to take out the cured product and the metal foil 22 is subjected to pattern etching, thereby forming a pattern portion 22a for the wiring layers provided on both surfaces.

(Fourth Embodiment)

FIG. 6(a) to FIG. 6(e) are views showing a process for a method of manufacturing a multilayer wiring board according to a fourth embodiment of the present invention. In the fourth embodiment according to the present invention, there is used the porous laminated product 30 set in a state in which a passive component T is provided between porous layers 11 and can be conductively connected to a wiring layer 20 or in a conductive connecting state. In particularly, the present embodiment is effective in the case where the thickness of the passive component T is less than the thickness of the adjacent porous layer 11. Only different portions from the above-mentioned embodiments will be described below.

Figure 6:
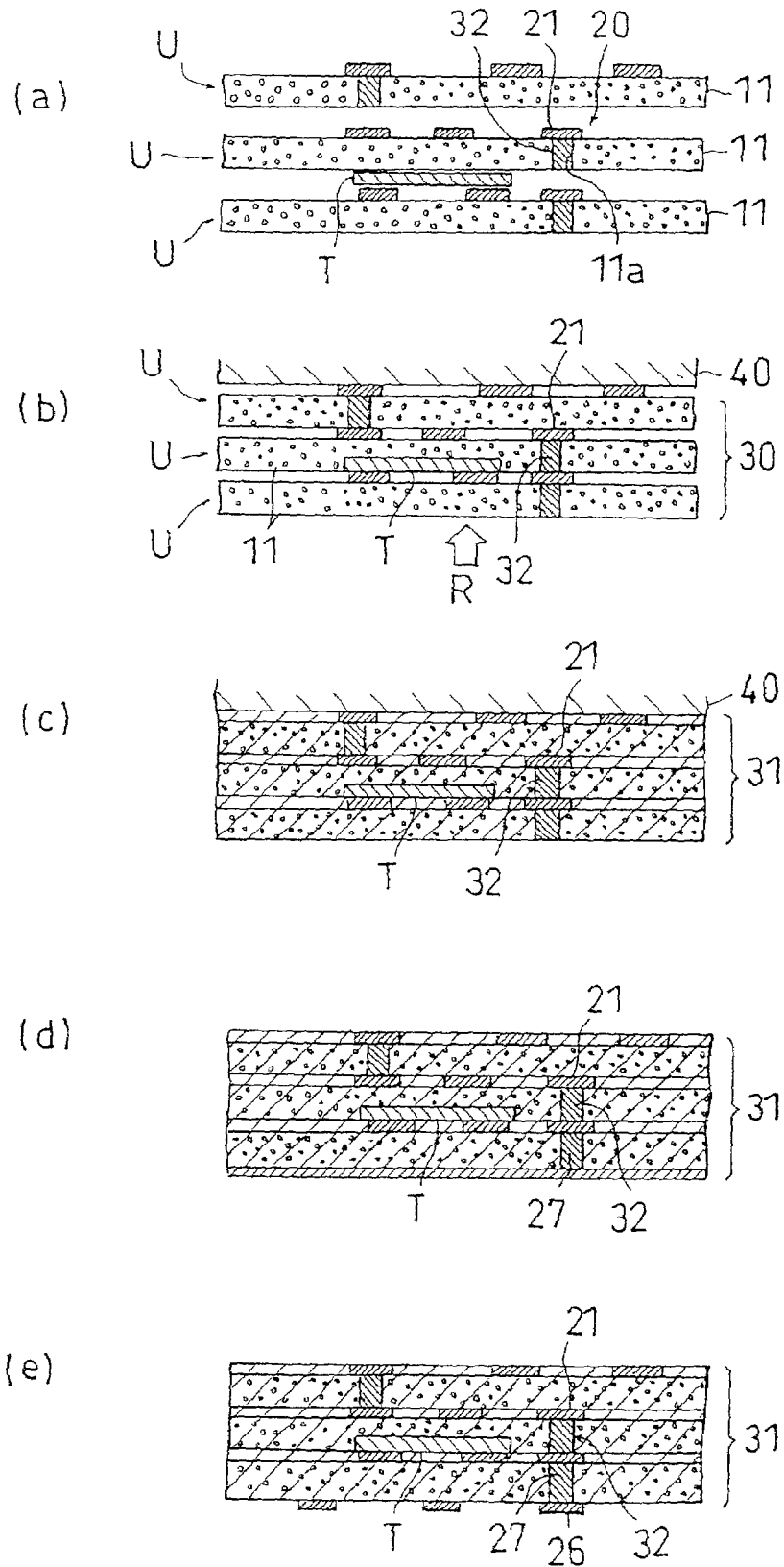
FIG. 6(a) to FIG. 6(e) are views showing a process for a method of manufacturing a multilayer wiring board according to a fourth embodiment of the present invention.

As shown in FIG. 6(a), first of all, the passive component T is provided such that a terminal portion (an electrode portion) of the passive component T can be conductively connected to a pattern portion 21 of a wiring layer 20 in a lamination unit U. Alternatively, the terminal portion of the passive component T is bonded to the pattern portion 21 by reflow soldering such that both of them are brought into a conductive connecting state.

Any of a resistor, a capacitor, a coil and the like is used for the passive component T and these may be formed into an array, a network or the like. Moreover, it is also possible to use an active component such as a semiconductor circuit (for example, a bare chip) or a transistor and an element constituting the passive component T and the like.

For example, an element constituting the resistor is formed by printing a carbon containing resin or the like. For example, an element constituting the capacitor forms a predetermined capacity between patterns (a material having a high dielectric constant may be used together if necessary). Examples of an element constituting a coil include a spiral wiring pattern. For the semiconductor integrated circuit, a semiconductor chip may be sealed and a bare chip or the like is preferable.

As shown in FIG. 6(b), next, the porous laminated product 30 of the lamination unit U is formed. At this time, the porous layer 11 to be pressed in contact with the passive component T is deformed and a space for providing the passive component T can easily be maintained. In a portion in which the porous layer 11 is deformed and pressed hermetically, the impregnating property of the raw material composition of a thermosetting resin is slightly reduced in some cases. However, insulating functions are not deteriorated at all. In the same manner as in the first embodiment, subsequently, the raw material composition of a thermosetting resin is impregnated and cured in the porous laminated product 30.

In the lamination structure of the multilayer wiring board obtained as described above, as shown in FIG. 6(e), at least one of the passive component T, the active component and the element constituting them is interposed between the porous layers 11 and is conductively connected to the wiring layer 20.

(Fifth Embodiment)

FIG. 7(a) to FIG. 7(e) are views showing a process for a method of manufacturing a multilayer wiring board according to a fifth embodiment of the present invention. In the fifth embodiment according to the present invention, there is used the porous laminated product 30 set in a state in which a passive component T is provided in an opening 11b of a porous layer 11 and can be conductively connected to a wiring layer 20 or in a conductive connecting state. In particular, the present embodiment is effective in the case in which the thickness of the passive component T is more than that of the adjacent porous layer 11. Only different portions from the above-mentioned embodiments will be described below.

Figure 7:
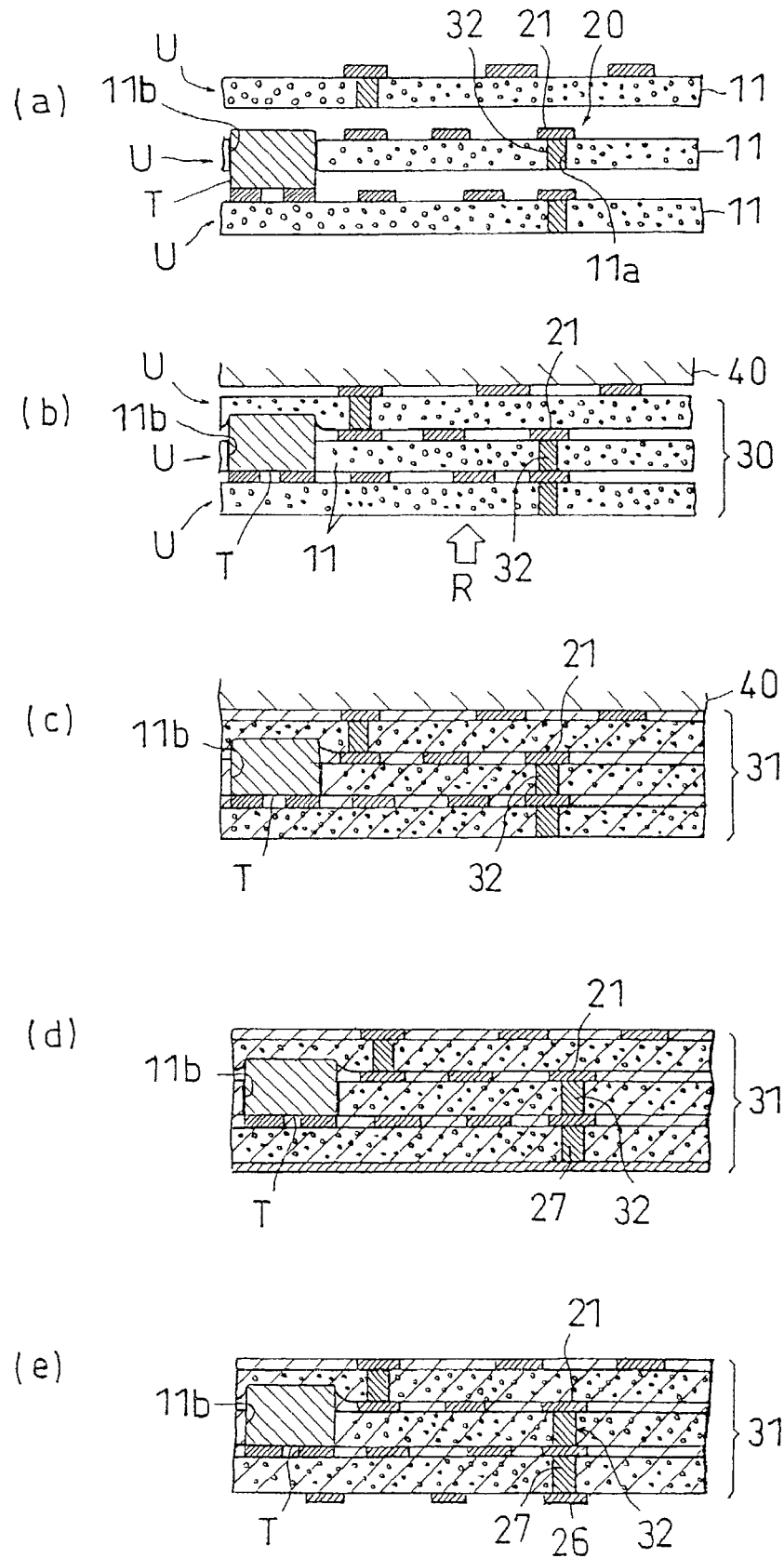
FIG. 7(a) to FIG. 7(e) are views showing a process for a method of manufacturing a multilayer wiring board according to a fifth embodiment of the present invention.

First of all, as shown in FIG. 7(a), the passive component T is provided such that a terminal portion (an electrode portion) of the passive component T can be conductively connected to a pattern portion 21 of a wiring layer 20 in a lamination unit U and an opening portion 11b of the porous layer 11 is provided in such a position that the passive component T to be arranged can be inserted. Alternatively, the terminal portion of the passive component T is bonded to the pattern portion 21 through reflow soldering such that both of them are brought into a conductive connecting state.

The shape and size of the opening portion 11b may be the same as or slightly different from the outer periphery of the passive component T. In the case in which the passive component T is not connected, the opening portion 11b can also have the function of positioning the passive component T. In that case, it is preferable that the shape and size of the opening portion 11b can hold the outer periphery of the passive component T.

Any of a resistor, a capacitor, a coil and the like is used for the passive component T and these may be formed into an array, a network or the like. Moreover, it is also possible to use an active component such as a semiconductor circuit (for example, a bare chip) or a transistor and an element constituting the passive component T and the like.

For example, an element constituting the resistor is formed by printing a carbon containing resin or the like. For example, an element constituting the capacitor forms a predetermined capacity between patterns (a material having a high dielectric constant may be used together if necessary). Examples of an element constituting a coil include a spiral wiring pattern. For the semiconductor integrated circuit, a semiconductor chip may be sealed and a bare chip or the like is preferable.

As shown in FIG. 7(b), next, the porous laminated product 30 of the lamination unit U is formed. At this time, the porous layer 11 to be pressed in contact with the passive component T is deformed and a space for providing the passive component T can easily be maintained. In a portion in which the porous layer 11 is deformed and pressed hermetically, the impregnating property of the raw material composition of a thermosetting resin is slightly reduced in some cases. However, insulating functions are not deteriorated at all. In the same manner as in the first embodiment, subsequently, the raw material composition of a thermosetting resin is impregnated and cured in the porous laminated product 30.

In the lamination structure of the multilayer wiring board obtained as described above, as shown in FIG. 7(e), at least one of the passive component T, the active component and the element constituting them is provided in the opening portion 11b of the porous layer 11 and is conductively connected to the wiring layer 20.

EXAMPLE

A specific example indicative of the structure and effect of the present invention will be described below. The evaluation of a vacancy rate or the like of the porous layer was carried out in the following manner.

(1) Vacancy rate of whole porous layer $$\text{Vacancy rate (\%)} = \{1-((\text{weight/density})/\text{volume})\} \times 100$$

The volume and weight of the porous layer were measured to calculate the vacancy rate by the above-mentioned equation using the density of a material.

(2) Mean pore size of section of porous layer

For the section of the porous layer, photographing was carried out by using a scanning type electronic microscope (SEM) so that the mean pore size of the section of the porous layer was obtained.

Example of Preparation of Metal Foil Having a Bump

A pattern was formed on a copper foil having a weight of 1 ounce and a metal foil having a bump was thus prepared by etching (half etching). In the metal foil having a bump, the height of the bump was 20 μm and the diameter of the bump was 150 μm.

Example of Preparation of Polyimide Porous Layer

A film formation solution comprising 19 parts by weight (molar ratio of 100:15:85) of BPDA (biphenyltetracarboxylic acid dianhydrate)—DDE (diaminodiphenylether)—PPD (paraphenylene diamine) based polyimide precursor and 81 parts by weight of N-methyl-2-pyrrolidone (NMP) was applied in a uniform thickness at a gap of 100 μm onto the surface of the metal foil having a bump by using a film applicator. Immediately after the application, the applied surface was immersed in pure water at 25° C. and a polyimide precursor was thus coagulated. After the coagulation, drying was carried out for one hour or more at 90° C. After the drying a heat treatment was carried out for three hours at 400° C. in the nitrogen atmosphere to heat and ring-close the polyimide precursor. Consequently, a polyimide porous layer formed on the copper foil was obtained. The polyimide porous layer had a thickness of 18 μm and a sponge structure, and had a whole vacancy rate of 50% and a mean pore size of 0.2 μm. Moreover, the upper surface of the conductive bump was wholly exposed.

By using the metal foil laminated plate, the copper foil was subjected to etching by an etchant, thereby forming a wiring pattern. The pattern formation was excellent.

Example of Preparation of Aramid Porous Layer

Aromatic polyamide (CORNEX produced by Teijin Limited) was dissolved in N-methyl-2-pyrrolidone (NMP), and furthermore, polyvinyl pyrrolidone (PVP) (K-90 produced by ISP Japan Co., Ltd.) and water were added thereto. Consequently, a polymer solution containing aromatic polyamide (9 parts by weight), NMP (83 parts by weight), PVP (4 parts by weight) and water (4 parts by weight) were obtained. The polymer solution was applied in a uniform thickness at a gap of 60 μm onto the surface of the metal foil having a bump by using a film applicator. Immediately after the application, the applied surface was immersed in a water tank at 60° C. to form a porous layer. Then, the porous layer was preserved in the water for 24 hours and the solvent was removed therefrom. Thereafter, drying was carried out for one hour or more at 90° C. The porous layer had a thickness of approximately 10 μm and a sponge structure, and had a whole vacancy rate of approximately 50% and a mean pore size of 0.2 μm. Moreover, the upper surface of the conductive bump was wholly exposed.

By using the metal foil laminated plate, the copper foil was subjected to etching by an etchant, thereby forming a wiring pattern. The pattern formation was excellent.

What is claimed is:

1. A method of manufacturing a multilayer wiring board comprising the steps of:
   providing a porous laminated product comprising (i) two or more porous layers, (ii) at least one wiring layer provided between the porous layers and formed on any of the porous layers, and (iii) at least one interconnect which penetrates at least one of the porous layers and contacts the wiring layer;
   impregnating the porous laminated product with a raw material composition of a thermosetting resin; and
   half curing or curing the raw material composition impregnated in the porous laminated product.

2. The method of manufacturing a multilayer wiring board according to claim 1, wherein the porous laminated product includes two or more wiring layers and is set in a state in which a pattern portion of the wiring layer is conductively connected between the wiring layers through the interconnect.

3. The method of manufacturing a multilayer wiring board according to claim 1, wherein the step of providing the porous laminated product comprises:
   providing a lamination unit including a porous layer having a plurality of through holes, a wiring layer formed on at least one of surfaces of the porous layer, and a conductor erected in the through hole from the pattern portion of the wiring layer, wherein the porous layer constitutes said two or more porous layer, the wiring layer constitutes said at least one wiring layer, and the conductor in the though hole constitutes said at least one interconnect; and
   laminating two or more lamination units.

4. The method of manufacturing a multilayer wiring board according to claim 3, wherein the step of providing the lamination unit comprises:
   providing a metal foil including conductive bumps having an almost equal height on a surface thereof;
   forming and attaching a resin porous layer onto the surface of the metal foil with the conductive bumps by a wet coagulating method; and
   etching the metal foil to form the pattern portion of the wiring layer to obtain the lamination unit.

5. The method of manufacturing a multilayer wiring board according to claim 1, wherein the porous laminated product is set in a state in which at least one of a passive component, an active component and an element constituting them is interposed between the porous layers and can be conductively connected to the wiring layer or in a conductive connecting state.

6. The method of manufacturing a multilayer wiring board according to claim 1, wherein the porous laminated product is set in a state in which at least one of a passive component, an active component and an element constituting them is provided in an opening portion of the porous layer and can be conductively connected to the wiring layer or a conductive connecting state.

7. A method of manufacturing a multilayer wiring board comprising the steps of:
   providing a metal foil having conductive bumps of almost equal height on its surface;
   form and attach a resin porous layer onto the surface of the metal foil with the conductive bumps by a wet coagulating method;
   etching the metal foil to form a pattern portion of a wiring layer, thereby obtaining a lamination unit;
   providing a porous laminated product comprising two or more of the lamination units;
   impregnating the porous layers with a raw material composition of a thermosetting resin; and
   half curing or curing the raw material composition.

* * * * *